United States Patent [19]

Laskaris

[11] Patent Number: 4,682,134
[45] Date of Patent: Jul. 21, 1987

[54] CONICAL, UNIMPREGNATED WINDING FOR MR MAGNETS

[75] Inventor: Evangelos T. Laskaris, Schenectady, N.Y.

[73] Assignee: General Electric Company, Schenectady, N.Y.

[21] Appl. No.: 740,921

[22] Filed: Jun. 3, 1985

[51] Int. Cl.$^4$ .............................................. H01F 7/22
[52] U.S. Cl. .................................. 335/216; 335/300; 336/DIG. 1
[58] Field of Search ...................... 335/216, 299, 300; 336/231, DIG. 1

[56] References Cited

U.S. PATENT DOCUMENTS

| | | | |
|---|---|---|---|
| 3,158,794 | 11/1964 | Swartz | 335/216 |
| 3,393,386 | 7/1968 | Hintz | 335/216 |
| 3,439,305 | 4/1969 | Klein | 335/216 X |
| 3,559,126 | 1/1971 | Drautman | 335/216 |
| 3,713,058 | 1/1973 | Santa-Maria | 335/216 |
| 3,715,452 | 2/1973 | Long | 335/216 X |

FOREIGN PATENT DOCUMENTS

| | | |
|---|---|---|
| 1160949 | 8/1968 | Fed. Rep. of Germany . |
| 2040298 | 8/1970 | Fed. Rep. of Germany . |
| 109205 | 6/1983 | Japan ................................. 335/216 |

OTHER PUBLICATIONS

Review of Scientific Instruments, vol. 41, No. 6, Jun. 1970, pp. 884–885, R. W. Fast, "High Pressure Performance of an Nb3Sn Ribbon Solen.

Revue de Physique Appliquee, vol. 8, No. 4, Dec. 1973, pp. 477–484; P. Gayte, "Bobine Supraconductrice Non Rayonnante".

IEEE Transactions on Nuclear Science, vol. NS-28, No. 3, Part 2, Jun. 1981, pp. 3283-3285, New York, C. Taylor et al., "A Novel Epoxy-Free Construction Method for Fabricating Dipole Magnets and Test Results".

Pat. Abstracts of Japan, vol. 9, No. 110, 5/15/85.
Pat. Abstracts of Japan, vol. 8, No. 176, 8/14/84.
Pat. Abstracts of Japan, vol. 5, No. 95, 6/20/81.
Pat. Abstracts of Japan, vol. 8, No. 44, 2/22/84.

*Primary Examiner*—George Harris
*Attorney, Agent, or Firm*—William H. Steinberg; James C. Davis, Jr.; Paul R. Webb, II

[57] ABSTRACT

An unimpregnated winding for use in a cryostat of a superconducting magnet is provided comprising a form including a shell having the shape of two truncated cones attached to one another at their respective bases. Superconducting wire is wrapped around the form under tension so that during superconducting magnet operation, the form remains under compression.

9 Claims, 8 Drawing Figures

FIG. 3

CONICAL MAGNET STRESS ANALYSIS

|  | unenergized | | energized | |
|---|---|---|---|---|
|  | 300K | 4K | 1.5T | 2.1T |
| Radial Displacements, Inches | | | | |
| Small Coil | −.045 | −.136 | −.122 | −.107 |
| Medium Coil | −.043 | −.130 | −.118 | −.106 |
| Large Coil | −.041 | −.119 | −.108 | −.099 |
| Axial Displacements, Inches | | | | |
| Small Coil — inboard | .008 | −.001 | −.001 | −.002 |
| — outboard | .005 | −.025 | −.029 | −.033 |
| Medium Coil — inboard | .014 | −.031 | −.036 | −.044 |
| — outboard | .010 | −.059 | −.066 | −.075 |
| Large Coil — inboard | .036 | −.058 | −.084 | −.093 |
| — outboard | .024 | −.129 | −.159 | −.177 |
| Radial Pressures, Psi | | | | |
| Small Coil | −390 | −380 | −530 | −670 |
| — form | −360 | −340 | −270 | −210 |
| — overwrap | −250 | −260 | −330 | −365 |
| Medium Coil | −420 | −400 | −525 | −620 |
| — form | −370 | −360 | −260 | −160 |
| — overwrap | −320 | −290 | −400 | −460 |
| Large Coil | −600 | −560 | −700 | −900 |
| — form | −400 | −380 | −350 | −160 |
| — overwrap | −330 | −410 | −590 | 480 |
| Hoop Stresses, Psi | | | | |
| Small Coil | | | | |
| — form | −27300 | −25200 | −18600 | −12600 |
| — winding | 17300 | 14000 | 22200 | 30100 |
| — overwrap | 50200 | 51300 | 70100 | 88200 |
| Medium Coil | | | | |
| — form | −27700 | −25500 | −18600 | −13500 |
| — winding | 17200 | 13800 | 19600 | 25700 |
| — overwrap | 50400 | 51600 | 65200 | 78500 |
| Large Coil | | | | |
| — form | −40000 | −32500 | −20900 | −14600 |
| — winding | 17600 | 14000 | 19500 | 23500 |
| — overwrap | 53600 | 55900 | 70500 | 81600 |

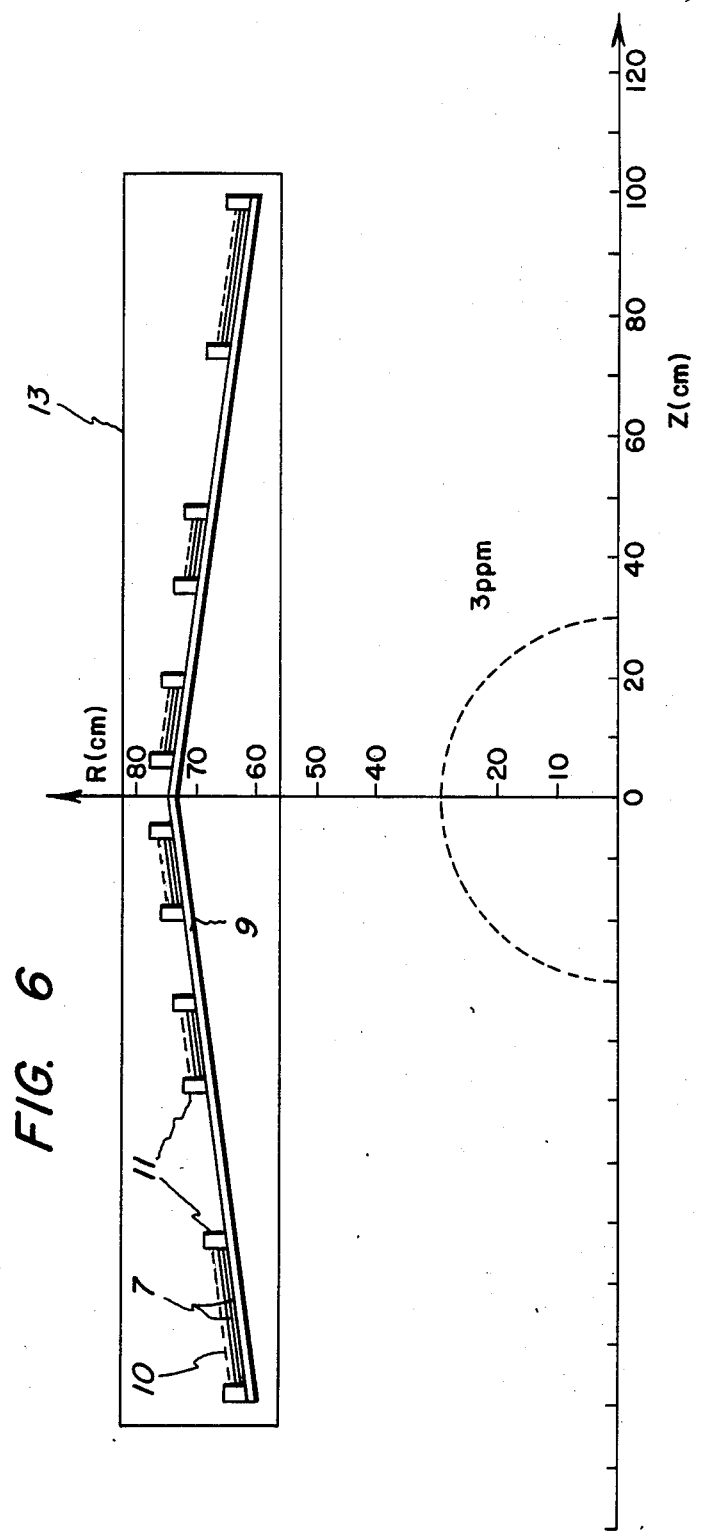

CONICAL, UNIMPREGNATED WINDING FOR MR MAGNETS

BACKGROUND OF THE INVENTION

The present invention relates to conical, unimpregnated windings for use in superconducting magnets.

Superconducting magnets allow for very high current densities in the magnet windings, enabling generation of very high magnetic fields, about 10 times the field generated by the most powerful resistive air core magnets. Since superconductors exhibit the property of carrying electrical current resistance free only at cryogenic temperatures, the magnets have to be cryocooled by liquid helium and nitrogen.

Epoxy-impregnated windings have proven, predictable performance in superconducting magnetic resonance magnets. The windings typically require an ultraclean, precision winding, complex epoxy-impregnation process, precision machining, and assembly to the cylindrical support structure. If the epoxy-impregnation of the wires and assembly to the support structure are not properly done, then, when the epoxy-impregnated windings and support are placed inside a cryostat and cryocooled by liquid helium, cracks between the support and epoxy-impregnated windings can occur due to the differential cooling rates of the form and the windings. Electromagnetic forces, due to the current flowing in the windings, exert outward forces on the windings. Any resulting movement of the windings can cause heating of the windings, raising a portion of the windings above the superconducting temperature, resulting in resistance heating of the winding. Resistance heating of a portion of the winding can further heat adjacent areas, resulting in a quench of loss of superconductivity of the current-carrying winding. The heat released from the winding can result in rapid evaporation of liquid helium from the cryostat.

Training is presently used to solve the wire movement problem in defective magnets. During training of the magnet, the magnet is supercooled and current flow is increased toward rated power. Wire movement occurs and a quench results. The magnet is again cooled and current levels increased in the hope and expectation that the windings that previously moved and caused the quench will stay in their new position. Training is a time-consuming, expensive (due to lost helium) and not always an effective fix.

There are limited degrees of freedom, to optimize the winding geometry of an epoxy-impregnated magnet, for reducing the peak field of the windings and, therefore, the stress that the windings are subjected to. This constraint results from the requirement to limit the coil axial length to help ensure void-free epoxy impregnation. Consequently, utilization of the epoxy-impregnated windings is less than optimum.

It is an object of the present invention to provide a non-impregnated winding for a superconducting magnet which can perform predictably without training.

It is another object of the present invention to provide a non-impregnated winding for superconducting magnets that is simple to manufacture and design to improve superconductor utilization and reduce cost.

It is still another object of the present invention to utilize the winding support structure to protect the winding during a quench and, thereby, eliminate magnet protection resistors.

SUMMARY OF THE INVENTION

In one aspect of the present invention a winding, for use in a cryostat of a superconducting magnet, is provided, comprising a form having a generally conical shape. Superconducting wire is wrapped around the form under tension so that during superconducting magnet operation, axial turn-to-turn compression between adjacent turns is achieved.

BRIEF DESCRIPTION OF THE DRAWINGS

While the specification concludes with claims particularly pointing out and distinctly claiming the present invention, objects and advantages of the invention can be more readily ascertained from the following description of the preferred embodiments when used in conjunction with the accompanying drawings in which:

FIG. 3 is a table showing a stress analysis of the winding and form of FIG. 1;

FIG. 6 is a partial sectional view of a double layer superconducting winding wound on a conical form for a 1.5 T magnetic resonance magnet.

DETAILED DESCRIPTION OF THE INVENTION

Figure 1:
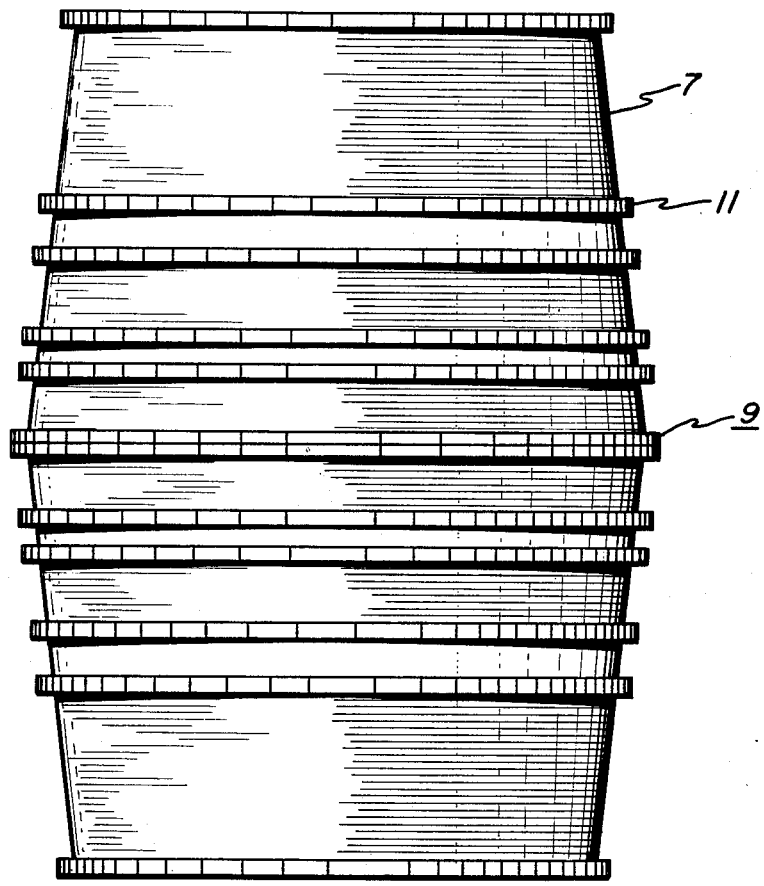
FIG. 1 is a side view of a single layer superconducting winding wound on a conical form in accordance with the present invention.
Figure 2:
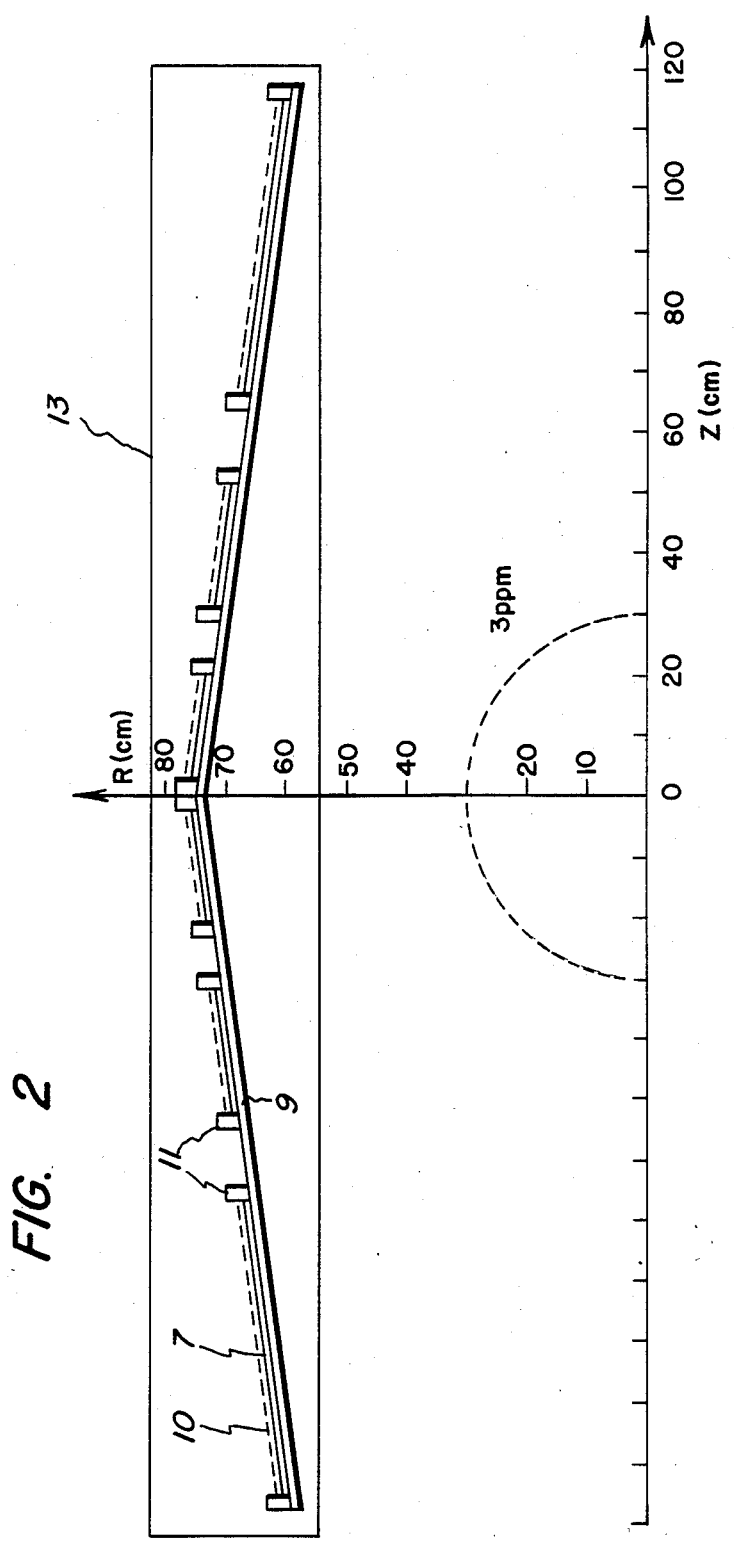
FIG. 2 is a partial sectional view of a single layer superconducting winding on the conical form of FIG. 1 for a 1.5 Tesla (T) magnetic resonance magnet shown in a cryostat housing.

Referring now to the drawings, wherein like reference numerals indicate like elements throughout and particularly FIGS. 1 and 2 thereof, an insulated superconducting winding 7 which can comprise a niobium-titanium alloy in a copper matrix covered by polyvinyl formal insulation, such as Formex ®, available from the General Electric Company, is wound under high tension (typically 20,000–40,000 psi) around a form 9 comprising two truncated conical shells symmetrically joined at their larger diameter bases. The superconductor is wound in sections defined by shoulders 11 extending circumferentially around the form. The shoulders are slotted axially to create circumferential gaps which thereby remove hoop stresses introduced by the windings so that the form's conical shape can be maintained after winding. Depending on the degree of field uniformity desired, the number of winding sections can be defined. The more winding sections, the higher the field uniformity inside the working area of the form. In superconducting magnets used in magnetic resonance imaging, field inhomogeneity in the magnet bore adversely affects image resolution.

The conical form 9 can be fabricated from aluminum, copper or fiberglass. If aluminum or copper is used, fabrication can be accomplished by rolling and welding. In mass production, the shell can be fabricated by spinning. Because of the conical surface, the superconductor is wound with axial turn-to-turn compression. The superconductor preferably has a rectangular cross section. It is preferable, but not essential, to wind the superconductor edgewise (narrow side of rectangular cross section contacting the form) so that the winding has fewer layers. Winding the superconductor under high tension is required to prevent detachment from the form because of the differential thermal contraction of the form and the winding and because of the magnetic loading resulting from the current flow in the windings during operation. Winding begins at the smaller diameter portion of a section and proceeds toward the larger diameter. When edge winding, "keystoning" or winding of the lower portion of the winding in contact with the form might occur, interfering with the proper alignment of further windings. Periodic placement of spacers between windings may be required to permit continued edgewise winding. When the winding of one section is completed, the superconductor is firmly secured to the shoulder such as by soldering, to maintain tension before beginning winding the next. The winding and form are shown situated in a cryostat 13 in FIG. 2. Also shown within a semicircular dashed line in FIG. 2 is a working volume in the interior of the truncated cone having an inhomogeneity of 3 parts per million or less.

Internal winding hoop stresses can be reduced by overwrapping the superconductor winding with uninsulated copper or aluminum wire 10 under tension. Referring now to FIG. 3, a conical magnet stress analysis for a 1.5 T magnet having the three single layer coils on each half of the form, of the type shown in FIGS. 1 and 2, is shown. The reference to a small coil in the table of FIG. 3. refers to the coil surrounding the larger diameter portion of the form, the large coil recited in the table refers to the coil on the small diameter portion of the form and the medium coil is situated between the large and small coil on each half of the form. "Inboard" and "outboard", in the table, refer to the side closer to the center and further away from the center of the form, respectively, as measured along the longitudinal axis of the form. The figures in the 300 K and 4 K columns are for an unenergized magnet at 300° Kelvin and 4° Kelvin, repectively. The 1.5 T and 2.1 T columns are for an energized magnet at 4° K. operation with a field strength of 1.5 T and 2.1 T, respectively. As shown in the table of FIG. 3, by proper selection of the winding and and overwrap tensions, the superconductor can be subjected to a residual tension at low temperatures. The tension in the superconductor increases as the magnet is energized because of the radially outward magnetic forces. The conical form is designed to be always under compression. Since the form is always under tension it ensures that the winding will never detach itself from the form and frictional heating, as a result of motion, will be minimal.

The uninsulated superconducting winding can be insulated from the inner and outer surfaces adjacent to it by an array of axial Mylar ®, Kapton ®, or leather insulating tapes (not shown) about 0.25–0.5 inch wide and 0.002–0.010 inch thick. These tapes are equally spaced circumferentially by a 0.1–0.3 inch gap so as to allow for the axial flow of liquid helim internal to the winding.

The winding is designed to restrain wire motion, yet it is conceivable that infinitesimal sudden wire movements can occur. To enhance the stability of the superconductor, the film insulated superconductor can be wrapped with a thin tape of high thermal conductivity metal, such as copper or aluminum. The tape can be 0.0005 to 0.002 inches thick and is wrapped with a small overlap. Further, a 0.0005–0.002 inch thick Mylar or Kapton tape ca be spiral-wrapped around the metal tape with 50% overlap to provide electrical insulation of the conductor.

Figure 4:
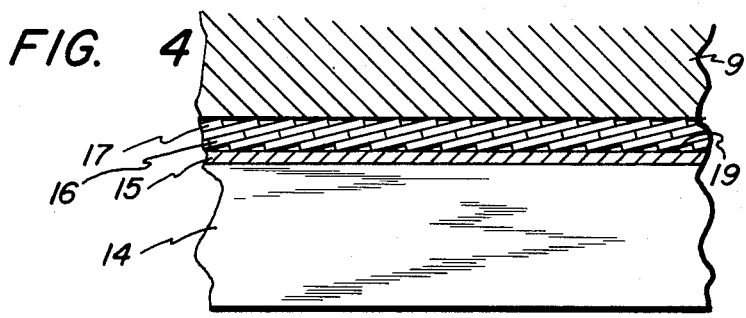
FIG. 4 is a partial cross sectional view of a superconducting wire covered with metal and insulation tapes.

FIG. 4 illustrates the surface of the superconductor wire 14 insulated with Formex 15 and covered with the metal tape 16 and insulating tape 17. The superconductor wire as described previously is coated with an insulating film, such as Formex. The gaps between the conductor and tapes are filled with liquid helium 19. Liquid helium has about 300 times higher specific heat than the surrounding solid material at 4° K. Consequently, even a small porosity of the winding filled with liquid helium considerably increases the specific heat of the porous winding. Because of the increased specific heat, any frictional heating generated by conductor motion is conducted by the metal tape to the helium with only a small temperature rise. Thus, the superconductor critical temperature is not exceeded.

The superconducting winding is electrically, closely coupled to both the metallic, conical form and the overwrap. This coupling can be beneficial from the standpoint of dissipating a large fraction of the winding magnetic energy during a quench, provided that the form or the overwrap are made from material with high electrical conductivity. Thus, the conical form and the overwrap can serve as protection resistors during a quench to reduce the energy absorbed by the superconducting winding.

Figure 5A:
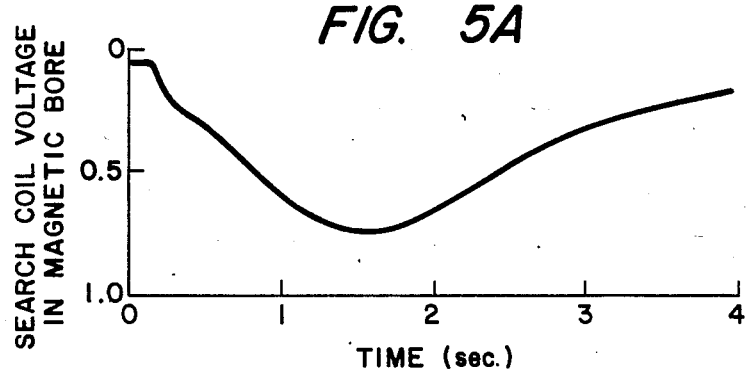
FIGS. 5A and 5B are graphs on a common time scale showing search coil voltage and magnet current during a quench of a superconducting magnet constructed according to the present invention.
Figure 5B:
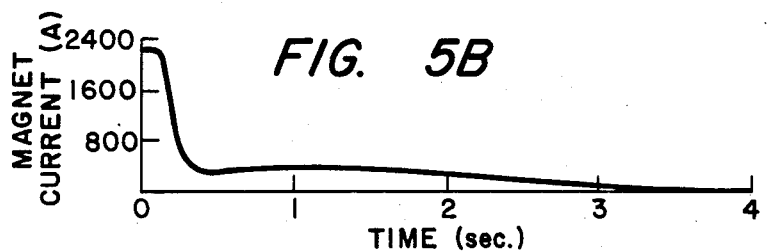

Referring now to FIGS. 5A and 5B, a graph showing the change in search-coil voltage in the magnet bore undergoing a quench is shown, together with the change in magnet current versus time. When the quench occurs, the magnet current is sharply reduced. However, the change in the magnetic field, as measured by the search-coil voltage, is seen to change gradually over time, showing that the magnetic energy during a quench is gradually dissipated.

Referring now to FIG. 6, another embodiment of the present invention is shown having two layers of insulated superconducting wire 7 wound under high tension on a form comprising two truncated cones of the type shown in Fig. 1. The winding is overwrapped with uninsulated copper or aluminum 10. It will be noted that the two-layer winding permits use of a form having a reduced axial length.

Figure 7:
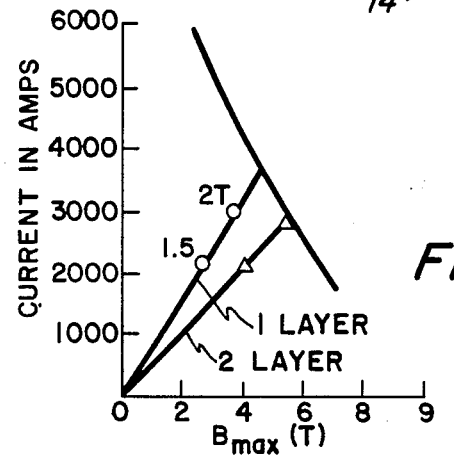
FIG. 7 is a plot showing the superconducting characteristics with a load line plotted as a function of field strength and wire current.

Referring now to FIG. 7, a superconducting characteristic is shown with a current versus field strength at 4.2° Kelvin which separates the normal region from the superconducting region. Two load lines for a one-layer and a two-layer design, respectively, with operating points at 1.5 and 2 T, are shown. The superconducting wire is assumed to have the cross-sectional dimensions 0.04×0.2 inches and be edge wound. The ratio of copper to superconducting alloy in the superconducting wire is assumed to be 1:7. It is seen, from the load line, that as the current in the superconducting winding is increased, a point will be reached where the superconductivity will be lost. It is seen that the 1.5 T operating point provides a safety margin in that the operating point is spaced apart from the superconducting/normal boundary.

The foregoing describes a non-impregnated winding for superconducting magnets that can perform predictably without training and is simple to manufacture and design so as to improve superconductor utilization and reduce cost.

While the invention has been particularly shown and described with reference to several preferred embodiments thereof, it will be understood by those skilled in the art that various changes in form and details may be made without departing from the spirit and scope of the invention.

What I claim is:

1. A winding for use in a cryostat of a superconductor magnet comprising:
   a form comprising a shell having the shape of two truncated cones joined at their respective bases; and
   superconducting wire wound circumferentially around said form under sufficient tension so that during superconducting magnet operation said form remains under compression.

2. The winding of claim 1 wherein said form further comprises radially protruding shoulders extending circumferentially around said form and axially spaced apart from one another, a portion of said winding having a plurality of turns with axial turn-to-turn compression between adjacent turns being wound between predetermined pairs of adjacent shoulders.

3. The winding of claim 2 wherein said shoulders define axially extending slots therethrough to avoid distortion of said form when said form is under compression.

4. The winding of claim 1 wherein said superconductor or winding further comprises a film insulator surrounding said winding.

5. The winding of claim 1 further comprising an array of equally spaced axially extending insulating tapes providing insulation from the radially inward and radially outward surface adjacent to each layer of superconductor winding so as to provide gaps between axially extending tapes to permit the flow of gas cryogen to the superconducting winding.

6. The winding of claim 4 further comprising an array of equally spaced axially extending insulating tapes providing insulation from the radially inward and radially outward surface adjacent to each layer of superconductor winding so as to provide gaps between axially extending tapes to permit the flow of gas cryogen to the superconducting winding.

7. The winding of claim 4 further comprising wire overwrapped around said superconductor winding under tension so that internal winding hoop stresses of said superconductor wire are reduced, said superconductor winding and overwrap winding tension selected so that the form remains under compression during superconductor magnet operation whereby the superconductor winding will not become detached from the form and frictional heating as a result of motion will be minimal.

8. The winding of claim 4 wherein said superconductor wire is wrapped with a metal tape of high thermal conductivity and further wrapped with a tape providing electrical insulation.

9. The winding of claim 1 wherein said superconductor wire achieves axial turn-to-turn compression between adjacent turns.

* * * * *